United States Patent [19]

Crick

[11] 4,291,204
[45] Sep. 22, 1981

[54] FAULT LOCATING SYSTEM FOR ELECTRIC CABLES AND THE LIKE

[76] Inventor: Robert G. Crick, 850 Mesa Ave., Palo Alto, Calif. 94306

[21] Appl. No.: 66,077

[22] Filed: Aug. 13, 1979

Related U.S. Application Data

[63] Continuation-in-part of Ser. No. 876,503, Feb. 9, 1978, abandoned.

[51] Int. Cl.³ .................. G01R 31/08; H04B 3/46
[52] U.S. Cl. .................. 179/175.3 F; 324/52
[58] Field of Search .................. 179/175.3 F, 175.3 R, 179/175.3 S; 324/51, 52; 340/256

[56] References Cited

U.S. PATENT DOCUMENTS 3,488,580  1/1970  Anderson et al. ........... 179/175.3 F

FOREIGN PATENT DOCUMENTS 1155653  6/1969  United Kingdom ......... 179/175.3 F

OTHER PUBLICATIONS

"Locating Faults in Air Core PIC Cables", by Demick, *Telephony*, Feb. 11, 1974, pp. 27-29.
"Evaluation of Underground Fault Location Techniques", EPRI TD-153, Apr. 1976, Electric Power Research Institute.
"Underground Cable Fault Location", A Handbook to TD-153, EPRI EL-63, Jan. 1977, Electric Power Research Institute.

*Primary Examiner*—Thomas A. Robinson
*Attorney, Agent, or Firm*—Thomas H. Olson

[57] ABSTRACT

A system for locating faults in an electric cable including a flyback transformer or inductor and control circuitry therefor for developing an arc through a high resistance short circuit between two conductors or one conductor and ground. The control circuitry limits the current flow in the arc to avoid burning or welding of the conductors but maintains the current so that the high resistance short appears temporarily as a low resistance short which can be detected. A low level DC bias current stabilizes the system, particularly in the presence of large line capacitance when the distance between the apparatus and the cable fault is large. The circuitry includes an audible tone generator which can be sensed by induction with known inductive pickup equipment. The circuit also allows use of a time domain reflectometer to determine the location of high resistance shorts from a remote location on the cable to which connections can be made.

28 Claims, 5 Drawing Figures

FAULT LOCATING SYSTEM FOR ELECTRIC CABLES AND THE LIKE

CROSS REFERENCE TO RELATED APPLICATION

This is a continuation-in-part of application Ser. No. 876,503; filed Feb. 9, 1978, now abandoned.

BACKGROUND OF THE INVENTION

1. Field of the Invention

This invention relates to a fault locator for electric cables, such as, telephone, power, or video cables, and more particularly to a system capable of locating high resistance shorts without fusing or excessively damaging the conductors and/or the insulation surrounding the conductors.

2. Description of the Prior Art

One technique for locating troubles or faults in a telephone cable is to apply to the cable pair between which there is a high resistance short a high voltage which welds the conductors of the pair to one another at the location of the fault to produce a hard short. The hard short can be located readily with bridge circuits and tone devices but the welding procedure, because it generates substantial heat, is likely to adversely affect conductor pairs in proximity to the defective pair.

Distance measurement techniques have also been employed, resistance and capacitance bridge circuits and time domain reflectometers being exemplary of such distance measurement circuits. These circuits are subject to inaccuracies due to variations in wire resistivity and capacitance plus unknown factors such as the degree of spiraling of the conductors in the cable and trench and the existence of buried loops. Such inaccuracies can be large enough to make the resultant measurements unusable in longer runs of cable. The resistance bridge technique is further complicated by the necessity of making connections at a far end of the cable and of having a good conductor pair in parallel with the pair under test. The time domain reflectometer is subject to similar distance inaccuracies and has limited usefulness because pulses produced thereby will be reflected only by a fault that has a resistance sufficiently low that when shunted by the characteristic impedance of the conductors will produce an impedance discontinuity which will reflect the pulse. Thus, unless there is a very low resistance short or a hard short, a time domain reflectometer does not locate a fault. Failure to accurately locate a fault, particularly in the case of buried cable, is inconvenient because excessive digging must be performed to locate and repair the fault. For this reason it is desirable to use a tone to pinpoint the location of the fault after using a bridge or time domain reflectometer to find its general locale, because the tone is not subject to the above mentioned distance inaccuracies. The tone, however, will travel past a fault unless it is a low resistance fault. Thus, the desirability of a method and apparatus for temporarily reducing the resistance of the fault without damaging the cable can be appreciated.

Another distance measuring system is disclosed in U.S. Pat. No. 4,023,154 (340/256). As is the case with a time domain reflectometer, the accuracy of the patented system functions well only with respect to certain types of cable faults, e.g., a hard short.

There is an impulsed arc technique that is used in power cables for locating ground faults. This technique charges a capacitor which is discharged between ground and the line containing the fault. This arcs over the fault and the current flow through the line and the arc causes a rapidly rising magnetic field which produces a "thump" that can be detected by a receiver coil, or by a sonic pickup. The technique has little use in conductor-to-conductor faults, however, because the magnetic fields produced by current flow through the two conductors cancel one another so that almost no signal can be received.

This technique has a further disadvantage in that the capacitor must be charged to a high voltage to start the arc, but once initiated, the arc has a very low voltage so most of the energy stored in the capacitor is wasted or dissipated in circuit resistances during discharge. Thus the thumper consumes a large amount of power and is heavy and inefficient. Further, it dissipates excessive energy in the arc and generates a large transient which precludes its use on telephone cable.

Two printed publications that summarize various fault locating procedures are:

1. *Evaluation of Underground Fault Location Techniques,* EPRI TD-153, April 1976, Electric Power Research Institute, and;
2. *Underground Cable Fault Location:* A Handbook to TD-153, EPRI EL-363, January 1977, Electric Power Research Institute.

SUMMARY OF THE INVENTION

According to the present invention a high resistance short is temporarily converted to a low resistance path by forming an arc through the short. The arc plasma has very low resistance to current flow while the arc plasma is sustained. In order to avoid injury to the wire or the insulation adjacent the circuit fault, the magnitude of the current flow through the arc and its duty cycle are limited so that the fault can be readily detected without damaging the wire or the insulation.

The specific embodiments of the invention that is disclosed hereinafter in conjunction with the accompanying drawings afford three modes of operation: (1) the circuit can send an audible tone over the pair of wires and the audible tone can be detected by inductive or sonic pickup equipment of more or less conventional form because the tone flows through the low resistance arc and therefore does not go beyond the fault; (2) because the fault appears as a very low resistance at the arc, it affords excellent reflection of pulses produced in a time domain reflectometer, and the circuit of the invention has a mode of operation for use with such equipment; (3) because the resistance of the arc plasma is low, the resistance of the wire loop to the fault at which the plasma occurs can be measured and from this measurement distance can be determined.

An object of the invention is to provide ready location of either conductor-to-conductor high resistance faults or conductor-to-ground faults. This object is achieved by causing an arc to form at the fault which produces arc plasma that appears to the test signals as a very low resistance as long as it is sustained.

Another object is to achieve the foregoing mode of operation without jeopardizing the conductors and/or the insulation surrounding the conductors. This object is achieved by providing circuitry that regulates and limits the amount of current flow through the arc and the duty cycle of same to an amount sufficient to appear as a low resistance but insufficient to unduly heat the conductor and/or the insulation.

An additional object is to provide a system which establishes the current through the arc plasma at the fault without wasting energy so that the system can be embodied in a lighweight, portable, battery powered apparatus. This object is achieved by using inductive rather than capacitive energy storage with power switching techniques so that the current in the arc can be limited and controlled in a nondissipative fashion. By contrast, energy is wasted in a current limiting resistor as is necessary in a system employing capacitive energy storage, and such energy waste prevents the use of batteries and increases the weight of the equipment.

Still another object is to provide a circuit that functions to locate hard shorts or low resistance faults as well as locating high resistance faults. This object is achieved by providing a circuit having an output that appears as a current source so that tone current from the apparatus will be driven into either a resistance fault or an arc.

Yet another object is to provide a fault locating circuit that has a plurality of output voltage ranges so as to avoid placing more voltage on a fault than is absolutely necessary. Achievement of this object is made possible by providing an inductor that has a plurality of taps thereon and by connecting a selected one of the taps to afford return of energy stored in the inductor to the power source should the load not absorb all energy at a particular voltage setting.

A further object is to provide a circuit which minimizes or eliminates tone current flow beyond the fault. This object is accomplished by employing pulsating direct current, rather than alternating current, for the tone current in order that the voltage across the arc at the fault need not traverse between positive and negative ionization potentials that are typically present in the arc. Traversal of such positive and negative ionization potentials would introduce an AC component into the cable capacitance beyond the fault and would render more difficult the detection of the fault.

A still further object is to provide fault locating apparatus which is effective over a broad range of distances between the fault and the circuit point at which the apparatus is connected. This object is achieved by providing a minimum DC bias current through the arc plasma; it is thought that the DC bias prevents the apparatus and the cable from acting as a relaxation oscillator which can occur particularly at great distances because of the relatively large cable capacitance.

The foregoing together with other objects, features and advantages will be more apparent after referring to the following specification and the accompanying drawing.

DESCRIPTION OF THE PREFERRED EMBODIMENTS

Figure 1:
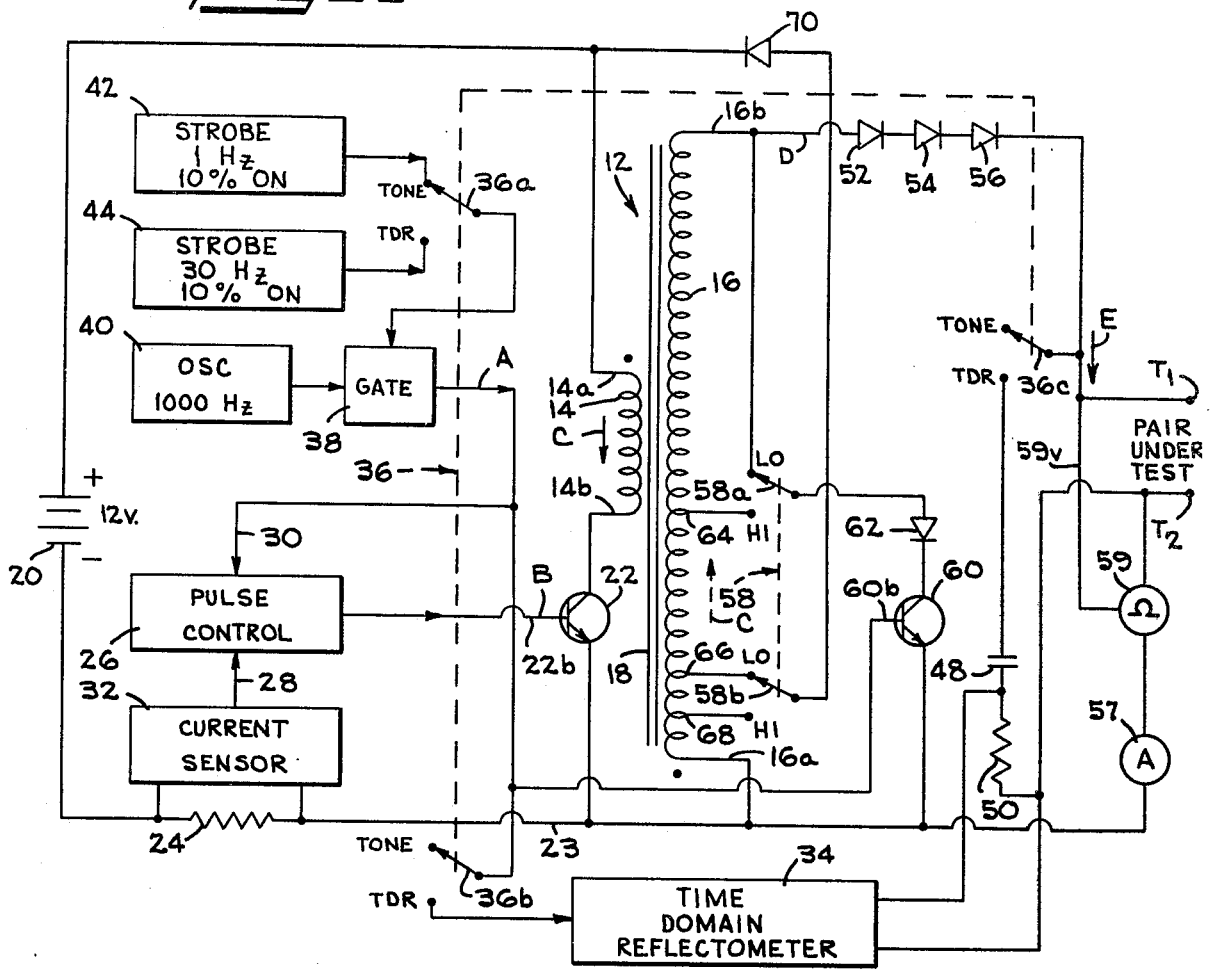
FIG. 1 is a schematic diagram of one preferred form of a circuit embodying the invention.

Referring more particularly to the drawing of FIG. 1, reference numeral 12 indicates a flyback or pulse transformer having a primary winding 14, a secondary winding 16, and a core 18. The core is flux linked to primary and secondary windings so as to store energy and transfer it between the windings. Core 18 functions as an inductor which first stores energy and which then delivers the energy at voltage and current levels dictated by control circuitry in accordance with the condition of cable fault.

Connected in series with primary winding 14 is a DC power source such as a battery 20 which has its positive terminal connected to the positive or dotted terminal 14a of winding 14. The opposite end 14b of the primary winding is connected through the collector-emitter circuit of a transistor 22, a common conductor 23, and a current resistor 24 to the negative terminal of battery 20. Thus, current flow through primary winding 14 can be controlled by signals supplied to base terminal 22b of transistor 22.

A pulse control circuit 26 has an output connected to transistor base terminal 22b. The pulse control circuit has a current level input 28 and a timing input 30. Current level input 28 is derived from a current sensor 32 which senses the current flow through current resistor 24; timing input 30 is controlled by pulse circuits which cause pulse control circuit 26 to turn on transistor 22 for prescribed periods. Pulse control circuit 26 functions to conduct to transistor 22 the timing signal applied to timing input 30 until such time as the current through current resistor 24, as sensed by current sensor 32, reaches a prescribed magnitude.

There is a mode switch 36 for selecting the mode of operation of the circuit, i.e., so as to produce an audible tone which can be traced by inductive pickup equipment or to adapt the circuit for employment with a time domain reflectometer 34 or like instrument that transmits a pulse to an impedance discontinuity in a cable and measures the time required for the pulse to be transmitted to and be reflected back from the discontinuity. The mode switch is a triple-pole double-throw switch that includes moving contacts 36a, 36b, and 36c. In FIG. 1 the movable contacts reside in an upward position to operate the circuit in a tone mode and in a downward position when the circuit is employed with a time domain reflectometer circuit. Moving contact 36a is connected to one input of a gate 38. To the other input of gate 38 is connected a 1000 Hz square wave oscillator 40. The upper fixed contact associated with moving contact 36a is connected to the output of a 1 Hz strobe 42 which functions to turn gate 38 on for ten percent of the time, i.e., the gate is turned on for 100 milliseconds and turned off for 900 milliseconds. Accordingly, the output A of gate 38 is a series of one hundred 0.5 millisecond pulses once each second. Such signal controls transistor 22 through pulse control 26. It will be noted that the upper fixed contact associated with moving contact 36b and 36c is inactive in the tone mode.

The lower fixed contact associated with moving contact 36a is connected to a 30 Hz strobe 44 that is on for 10% of the time so as to turn on gate 38 for about 3.3 milliseconds and to turn off the gate for about 30 milliseconds. Thus, when moving contact 36a is connected to the lower fixed contact, output A of gate 38 produces three 0.5 millisecond square wave pulses between quiescent periods of about 30 milliseconds. Gate 38 controls pulse control 26 and is also connected through the lower fixed contact associated with moving contact 36b to a time domain reflectometer 34 of conventional form. Such signal synchronizes the time domain reflectometer at a 30 Hz rate such that the CRT output of the time domain reflectometer does not flicker. In the alternative, the 30 Hz rate can be adjusted in synchronism with internal sweep rate of the time domain reflectometer, if it is so equipped. The output of the time domain reflectometer 34 is connected to output terminals $T_1$ and $T_2$ of the circuit. There is a coupling capacitor 48 in series with an impedance matching resistor 50 connected across output terminals $T_1$ and $T_2$ through the lower fixed contacts associated with moving contact 36c; time domain reflectometer is connected to the common point of the capacitor and the resistor. In the TDR mode, the circuit of the invention can also be employed with a fault location detecting apparatus of the type disclosed in U.S. Pat. No. 4,023,154.

The upper or non-dotted terminal 16b of secondary transformer winding 16 is connected to the output terminal $T_1$ through series diodes 52, 54 and 56. The opposite end 16a of the secondary winding, i.e., the dotted end, is connected to output terminal $T_2$ through common conductor 23, an ammeter 57 and an ohmmeter 59. Ohmmeter 59 has a voltage lead 59v connected to terminal $T_1$ and functions to display the quotient voltage/current=resistance in order to provide an approximation of conductor resistance from which distance can be derived.

Associated with secondary transformer winding 16 is a range switch 58 having moving contacts 58a and 58b. As shown in the drawing, there are two fixed contacts associated with the respective moving contacts, the fixed contacts being designated low and high. Although two sets of fixed contacts suffice to describe the manner and mode of practicing the present invention and to exemplify a system having a plurality of ranges, additional fixed contacts can be employed to advantage in order to afford more precise ajustment of the maximum output to accomodate a wider variety of cable faults.

Moving contact 58a is connected to the collector-emitter circuit of a transistor 60 through a diode 62. The emitter terminal of transistor 60 is connected to common conductor 23. Transistor 60 has a base terminal 60b which is connected to the output of gate 38. The upper fixed contact associated with moving contact 58a is connected to the upper non-dotted terminal 16b of transformer secondary winding 16. The lower fixed terminal associated with moving contact 58a is connected to a tap 64 of secondary winding 16. The upper fixed contact associated with moving contact 58b is connected to a tap 66 of secondary winding 16 and the lower fixed contact associated with moving contact 58b is connected to a tap 68 of the transformer secondary winding. As can be seen in FIG. 1, there is a greater number of turns between the lower terminal 16a of the secondary winding and tap 66 than there is between the lower terminal and tap 68. Moving contact 58b is connected to the positive terminal of battery 20 through a diode 70.

The operation of the circuit of FIG. 1 will first be described in the tone mode in which mode switch 36 resides in the position shown in the drawing so as to produce an audible tone that is transmitted out to the fault but does not pass beyond the fault. With the conductors of the pair under test connected to terminals $T_1$ and $T_2$, respectively, gate 38 produces a square wave A which causes pulse control 26 to supply a square wave B to base terminal 22b of transistor 22. Transistor 22 is thereby turned on so that current flows through primary winding 14 in a direction indicated by solid arrow C. Square wave A from gate 38 also turns on transistor 60 to permit current flow in a direction indicated by dotted arrow C in the secondary winding should transistor 22 be turned off before square wave A ends. Such current flow causes secondary tap 66 to be positive with respect to dotted secondary terminal 16a; the voltage level at tap 66 is limited to that of battery 20 because of the connection from the tap to the battery through contact 58b and diode 70. Current flow in the primary causes the dotted end 14a of the primary transformer winding 14 to be positive with respect to non-dotted end 14b, and dotted end 16a of secondary winding 16 to be positive with respect to non-dotted end 16b. At the outset of operation between times $A_1$ and $A_2$ current flows through the primary winding for the full 0.5 millisecond period producing an inductive ramp of current as shown at $C_1$ in FIG. 2C. Between times $A_2$ and $A_3$ transistor 22 turns off and the energy stored in core 18 causes flyback to occur in the transformer forcing the undotted ends 14b and 16b of primary 14 and secondary 16 to suddenly become positive with respect to the dotted ends, in consequence of which the energy previously stored in the core is released by driving a current from the secondary winding through diodes 52, 54 and 56 to the pair under test. This current will charge the pair capacitance to a voltage that may or may not be great enough to produce an arc at the fault. If this flyback pulse does not charge pair capacitance to a voltage necessary to produce an arc at the fault (or to a voltage equal to the maximum voltage setting) then a succeeding pulse will do so.

At flyback the upper or undotted terminal 16b of secondary winding 16 goes positive, to produce a voltage pulse $D_1$, which delivers current through diodes 52, 54 and 56 to the pair connected to terminals $T_1$ and $T_2$. Most or all of the current delivered to the conductor pair by the first pulse may be dissipated in charging the capacitance between the conductors. When the succeeding 0.5 millisecond pulse is produced at $A_3$, both transistors 22 and 60 are again caused to conduct, the former affording current flow through primary winding 14 and consequent storage of energy in core 18. So long as transistor 22 conducts, secondary winding 16 is polarized such as to back bias diode 62 and prohibit current flow through transistor 60. At the termination of the square wave pulse from gate 38 both transistors are cut off, flyback occurs, and another voltage pulse $D_2$ is produced across secondary winding 16 and the conductor pair connected to terminals $T_1$ and $T_2$.

Because the line capacitance remains charged, voltage pulse $D_2$ reaches the cable fault to strike an arc thereacross whereby the voltage rapidly falls to a level $V_a$ (see FIG. 2D). The consequent current flow through the plasma at the fault and the conductor pair can then occur at a sufficiently low voltage that all the energy stored in the core is not exhausted in the 0.5 millisecond flyback period. Thus, during the following 0.5 millisecond period when transistor 22 conducts, the primary current begins ramping up from a magnitude greater than zero as shown at $C_3$. When the primary current reaches a predetermined magnitude, current sensor 32 responds to cut off pulse control 26 and transistor 22 before the 0.5 millisecond duration of the pulse from gate 38, such cutoff occurring at $t_1$ (see FIG. 2B). This reduces the energy transferred from primary winding 14 to core 18 so that upon flyback, occurring when transistor 60 is turned off, the energy delivered to the pair will be sufficient to sustain the arc plasma across the fault but insufficient to cause the conductors to fuse. The predetermined current through current resistor 24 to which sensor 32 responds is determined by the maximum permissible current through the conductors under test and by the turns ratio between windings 14 and 16. For example, in a case where the current through the conductors must be limited to 1 ampere and the transformer turns ratio is 1:10, current sensor 32 is arranged to turn off pulse control 26 when 10 amps through current resistor 24 is sensed. Stated otherwise, if there are $n_p$ turns in primary winding 14, and $n_s$ turns in secondary winding 16, the current in the secondary winding will be $n_p/n_s$ times the current in the primary winding.

Inherent in the operation of the circuit of FIG. 1 as described above is the fact that energy stored in the inductance of transformer 12 is not suddenly discharged at the instant the arc plasma is formed across the fault as would be the case if a capacitive energy storage element were used. The energy remains stored in the inductance and is supplied to the conductors at a much slower rate after the arc plasma is formed because establishment of the arc plasma reduces the output voltage while maintaining the current flow the same. The energy stored in the inductance of transformer 12 allows current sensor 32 to cut off pulse control 26 and transistor 22 early in each cycle, so less power is consumed after the arc is established. The fact that this inductive energy system is more efficient and consumes less power then an equivalent capacitive energy storage system allows the inductive system to be embodied in a smaller, lighter weight package.

When transistor 22 turns off before the expiration of the 0.5 millisecond period in response to a predetermined current sensed by current sensor 32, the flyback transformer tends to sustain the NI (turns times current) product that flowed in the primary prior to transistor 22 turning off. Such tendency causes the transformer to start to fly back in order to maintain that product. This condition will not produce an output pulse, however, because as secondary terminal 16b goes positive, it causes current flow through diode 62 and transistor 60 into secondary terminal 16a. Thus, so long as transistor 60 is turned on, such current circulates and holds the energy stored in the core at a substantially constant magnitude. However, when pulse A ends at the expiration of 0.5 millisecond, transistor 60 turns off and flyback occurs so as to deliver current into the pair connected to terminals $T_1$ and $T_2$. Thus, it will be seen that the purpose of transistor 60 is to prevent current from flowing in the pair for greater than 50 percent of the tone frequency period. Limitation of current flow to 50 percent of the tone frequency period increases the AC tone modulation component on the current flowing to the conductors without increasing the average value of DC current flowing during the strobe period. This provides for an increase in the AC value of the tone current flowing to the fault, but only when locating a close-in dead short; transistor 60 is much less effective in ensuring proper operation of the circuit for more remote faults.

Accordingly, when the circuit operates in the tone mode, there is a 1000 Hz pulse or tone delivered to the line which tone flows through the arc plasma across the fault and does not flow beyond the fault. Because, as can be seen in curve D in FIG. 2, the voltage delivered to the line by transformer secondary 16 is turned off a very short time, the arc plasma through the fault is sustained and does not have to be restarted on each succeeding pulse.

After 100 milliseconds, strobe 42 disables gate 38 so that no further pulses are produced for a 900 millisecond period. During the period, the arc across the fault is extinguished and some cooling takes place. Additionally, the 1000 Hz tone strobed at one Hz is easier to pick up and identify than a constant 1000 Hz tone. The tone produced as described above can be detected by a conventional inductive pick-up transducer. Alternatively, a microphone can be employed because the presence of the arc plasma at the fault has the consequence of producing an audible tone that can be picked up sonically.

The circuit, when operating in the tone mode with the exemplary parameters set forth above, operates on a duty cycle of 1/20, more or less. This not only avoids injury to the conductors under test and the insulation surrounding the conductors, but permits the circuit to be embodied in a small, lightweight portable apparatus that is suitable for field use.

With range switch 58 in the upper or "Lo" position as shown in FIG. 1, the maximum output voltage produced by transformer secondary 16 is relatively low, e.g., in the range of 200–500 volts. It is relatively low because its magnitude is proportional to the ratio of the number of turns between the lower or dotted end 16a of the transformer secondary winding and tap 66 and the total number of turns in the transformer winding 16. When the range switch is moved to the high position, however, the maximum output of the transformer is proportional to the ratio of the number of turns between the lower or dotted end 16a of the secondary winding and tap 68 and the total number of turns in the secondary winding 16. The high voltage range produces a voltage of 2000 volts or higher, the higher voltage sometimes being necessary to establish an arc across a cable fault that has a relatively high resistance. In normal operation the high range is employed only when establishment of an arc plasma across the fault cannot be achieved in the low range.

System operation will be recapitulated with specific reference to the flyback phenomenon achieved by transformer 12. When transistor 22 is turned on, current flows downward in primary winding 14 so that the dotted or upper terminal 14a of the winding is positive with respect to the lower terminal 14b. This stores energy in core 18. Should the current sensor cause pulse control 26 to terminate pulse B before the end of pulse A, transistor 22 will turn off at which time, but for the presence of transistor 60, the voltage across the primary and secondary windings would reverse. So long as transistor 60 remains turned on, however, there is no output from secondary winding 16. When transistor 60 is turned off by signal A from gate 38, the upper or non-dotted terminal 16a of secondary winding 16 becomes positive and the voltage pulse is applied to the pair connected to terminals $T_1$ and $T_2$. Because the forward voltage drop of diodes 52, 54 and 56 exceeds the forward voltage drop of diode 62 and transistor 60 when turned on, no signal reaches the pair until the latter transistor is turned off. The magnitude of the voltage pulse is limited because of current flow in the path from taps 66 or 68 through moving contact 58b and diode 70 back to the battery 12, which also returns some of the energy to the battery until an arc is formed or the pair under test otherwise draws current.

When employing the circuit of the invention with a time domain reflectometer, circuit operation is very similar to that described hereinabove. First, mode switch 36a is operated to position the moving contacts in contact with the lower fixed contacts. This connects strobe 44 to gate 38 so that pulse control 26 and transistor 60 receive approximately three 0.5 millisecond pulses every 1/30th of a second. Such repetition rate is sufficient to initiate an arc plasma across the cable fault. Although in some circumstances the arc may be extinguished during the 30 millisecond quiescent period, the arc will be re-established by at least one of the succeeding three 0.5 millisecond pulses. When the arc plasma is present the fault has a small resistance as compared to the characteristic impedance of the line. Thus, when the time domain reflectometer transmits a pulse, the pulse is reflected back to the time domain reflectometer by the low resistance at the arc plasma so that the measurement of elapsed time and therefore distance is accurately displayed by the time domain reflectometer without welding the wires at the location of the fault. Of course, at all times the current flow through current sensing resistance 24 is sensed to limit the on time of transistor 22, which limits the energy input to transformer 12 thereby avoiding excessive heat at the fault.

When employing the circuit of the invention to give a resistance reading on ohmmeter 59, the mode switch 36 can be in either the tone position or time domain reflectometer position. In either mode the circuit causes an arc to be formed at the fault. The resultant plasma appears as a low resistance to the current flow therethrough. This arc plasma resistance is usually lower than the resistance of the wires leading to the fault. The resistance of the wire loop including the established arc is computed within the ohmmeter by voltage/currentresistance. From this quotient a constant can be subtracted representing the arc plasma resistance, and the resultant is the resistance of the wire loop to the fault, from which distance can be determined.

Figure 3A:
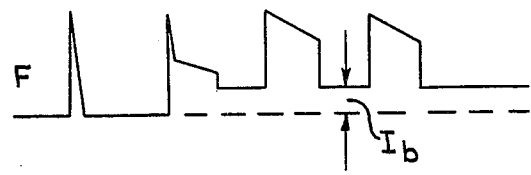
FIG. 3A is a plot of current versus time for a point in the circuit of FIG. 3 and corresponding to curve E in FIG. 2.
Figure 3:
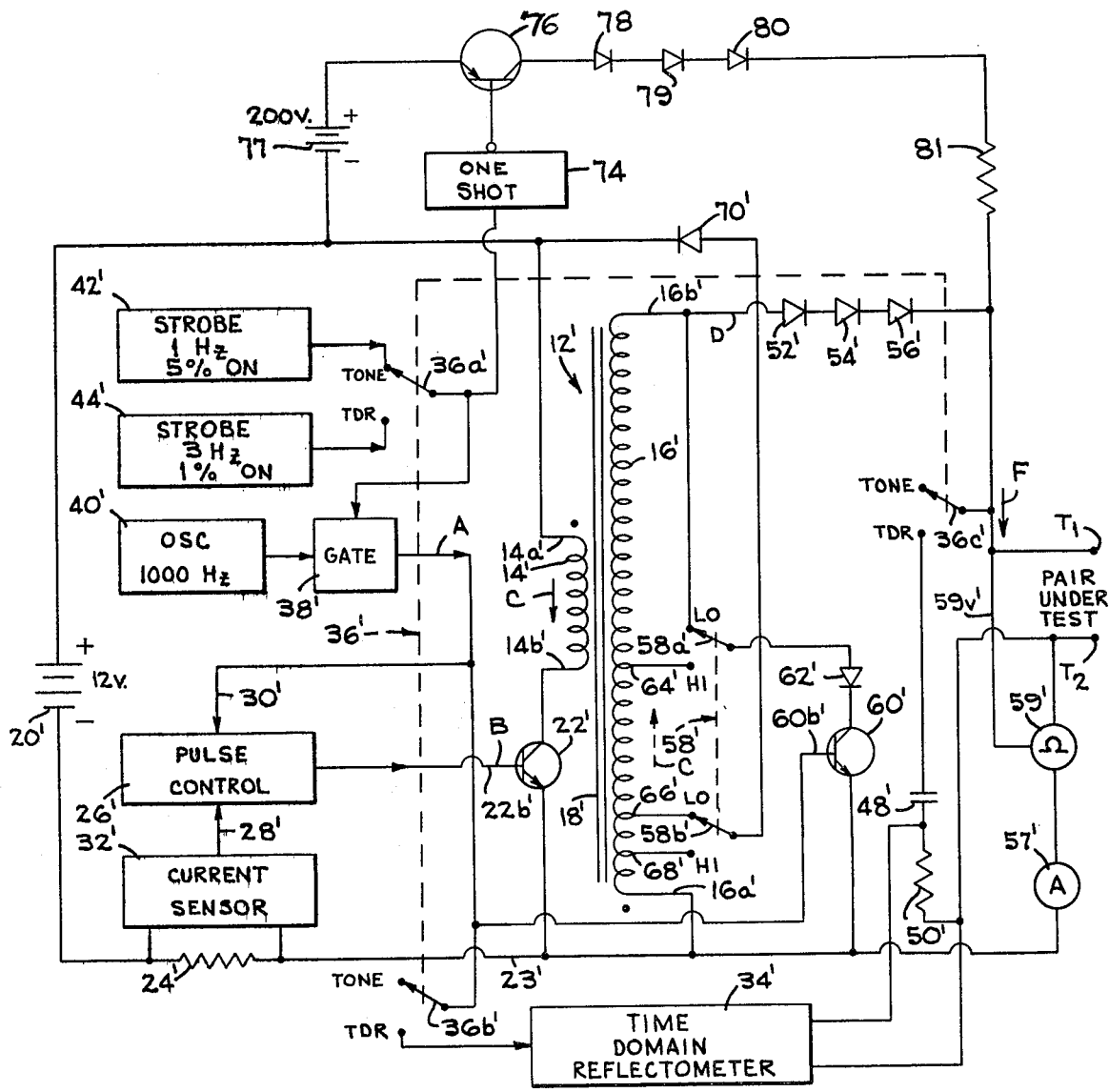
FIG. 3 is a schematic diagram of an alternate preferred form of a circuit embodying the invention.

Referring to FIG. 3, a modification of the invention is shown in which a DC bias is controllably applied to the pair under test. It has been found that the presence of the DC bias, in a magnitude such as one ampere, renders operation of the apparatus more stable, particularly when the distance between the apparatus and the fault is long. The reason for the improved performance of the circuit in presence of the DC bias is thought to result from the fact that the conductor capacitance, particularly at long distances, is sufficiently large that a relaxation oscillator is formed and the presence of the DC bias swamps out any tendency for the circuit to operate as a relaxation oscillator; this theory of operation is given without intending to limit the scope of the appended claims. Because many of the elements of FIG. 3 are identical or similar to corresponding elements shown in FIG. 1, reference numerals with the addition of a prime are employed in FIG. 3 to identify such similar elements. Thus, in common with the circuit of FIG. 1, the circuit of FIG. 3 includes a fly back transformer 12' which has a primary winding 14' and a secondary winding 16'. Current flow through primary winding 14' is controlled by a transistor 22' having a base terminal 22b connected to a pulse control 26'. The pulse control operates to turn on transistor 22' in response to a signal on a path 28' from a current sensor 32' and in response to a gating signal on a circuit path 30' from a gate 38'. Gate 38' produces bursts of 1000 Hz signals produced by an oscillator 40', the bursts occurring at a rate dictated by the position of a moving contact 36a' of a mode switch used to select either a tone mode of operation or a TDR mode of operation. When moving contact 36a' is in contact with the upper fixed contact of the switch, gate 38' is controlled by a strobe 42' which operates at one Hz and is on for 5% of the time. It should be noted that the on time for strobe 42' is less than the on time for strobe 42 in the circuit of FIG. 1. A lower on time or lower duty cycle reaches the overall duration of the arc plasma at the cable fault which is desirable in view of the fact that a DC bias adds to the power that must be dissipated at the fault as will be explained hereinafter. When the circuit is in the TDR mode and moving contact 36a' is connected to the lower fixed switch contact, strobe 44' controls gate 38'. Strobe 44' operates at 3 Hz and is on only 1% of the time so as to reduce the duty factor as indicated above. Strobe 44' produces 3 pulses per second, each pulse having a duration of 3.33 milliseconds. As is the case in the circuit of FIG. 1, moving switch contacts 36b' and 36c' operate in unison with moving contact 36a' to switch the apparatus between the tone mode of operation and the TDR mode of operation.

For providing the DC bias to the pair under test that is connected to terminals $T_1$ and $T_2$, the input of a one shot or monostable multivibrator 74 is connected to moving contact 36a' so that the one shot is triggered by strobe 42' in the tone mode and by strobe 44' in the TDR mode. One shot 74 is arranged so that the timing thereof is 50 milliseconds, initiated by the leading edge of each strobe pulse. It should be noted that the 50 ms period of one shot 74 is equal to the on time of strobe 42; thus it has no effect in the tone mode, but serves to hold transistor 76 on for a period longer than the 3.33 ms strobe pulse of strobe 44 when in the TDR mode. An inverting output of the one shot is connected to the base terminal of a transistor switch 76 so that the transistor conducts when the one shot triggers and for 50 milliseconds thereafter. To the emitter terminal of transistor 76 is connected the positive terminal of a 200 volt power source 77, the negtive terminal of which is connected in common with the positive terminal of power source 20'. The output or collector of transistor switch 76 is connected through series diodes 78, 79 and 80 and a series resistor 81 to output terminal $T_1$.

The secondary winding 16' of transformer 12' has the same taps and high-low switch 58' as described hereinabove in conjunction with FIG. 1. Additionally there is a transistor 60' connected across secondary winding 16' and control circuitry for the transistor that is identical in structure and function to that described hereinabove in connection with FIG. 1.

The inclusion in the circuits of FIGS. 1 and 3 of transistors 60 and 60', respectively, is to exemplify any suitable means for controllably shunting the secondary transformer winding when the primary current is interrupted before signal A returns to zero. Controllably shunting secondary current after interruption of primary current delays flyback so as to avoid application of excessive power to the pair under test. Other means for controllably shunting the secondary include silicon controlled switches and the like.

Figure 2:
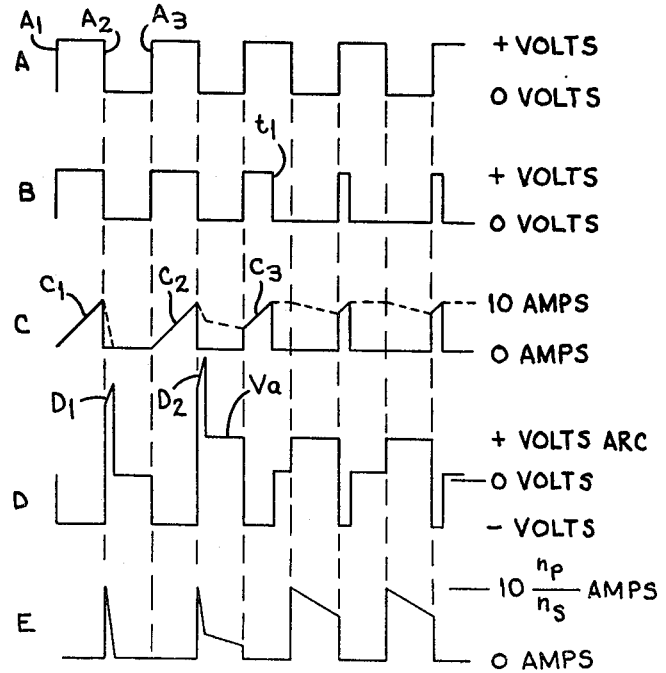
FIG. 2 is a plot of voltage or current vs. time at various points in the circuit of FIG. 1.

In operation, the embodiment of FIG. 3 is substantially identical to the operation of the embodiment of FIG. 1 in that a conductor pair having a defect of unknown location is connected to terminals $T_1$ and $T_2$. If operation in the tone mode is desired switch 36' is moved to the tone position so that the moving contacts contact the upper fixed contacts as seen in the drawing. The output of oscillator 40' is not transmitted through gate 38' until the gate is enabled from strobe 42'. At the rate of one Hz, strobe 42' turns on the gate for 50 milliseconds. During that period the 1000 Hz signal from oscillator 40' is fed through gate 38' and is as shown in curve A of FIG. 2. This causes pulse control 26' to apply a signal B to transistor 22' so that primary current as shown in curve C of FIG. 2 is induced in transformer primary winding 14'.

Different strobe timings from those shown in FIG. 1 reduce the duty cycle and thus limit the power dissipation in the arc plasma across the cable fault. The difference produced by the DC bias, which is controllably injected into the cable through transistor 76, can be seen in FIG. 3A. FIG. 3A corresponds to curve E of FIG. 2 except that the DC bias, indicated at $I_b$, prevents the current through the arc plasma from returning to zero so long as transistor 76 is on. As indicated previously the presence of the DC bias reduces or eliminates any tendency for the capacitance of the conductor pair between the point of attachment of the apparatus and the arc plasma from going into relaxation oscillation, a problem that can exist when the distance to the fault and the capacitance between the pair is great. Because the 1000 Hz signal depicted in FIG. 3A is on for a shorter time, the overall power dissipation in the arc plasma is maintained within a range such as to avoid destruction of the conductors or of the insulation adjacent to the cable fault.

In order to operate the circuit of FIG. 3. in the TDR mode, switch 36' is moved so that the moving contacts are in contact with the lower fixed contacts. Each strobe pulse from strobe 44' turns on gate 38' at a rate allowing delivery of approximately three pulses at 1000 Hz from oscillator 40', through pulse control 26', to turn on transistor 22' and store energy in core 18'. Flyback action in transformer 12' will then cause three current pulses to be delivered to the pair under test through diodes 52', 54', and 56'. Each current pulse charges the pair capacitance to successively higher voltages at a polarity such as to back bias diodes 78, 79 and 80. Eventually the voltage reaches a magnitude to cause the fault to arc over. While the arc plasma is present, a sufficiently low voltage exists across terminals $T_1$ and $T_2$ to forward bias diodes 78, 79 and 80 and allow bias current $I_b$ to flow through switch 76, the diodes and resistor 81 and through the established arc. The arc will be sustained for the fifty millisecond period of one shot 74. During the period after the third pulse from transformer 12' until expiration of the fifty millisecond period, time domain reflectometer measurements are made. Thus in the TDR mode, transformer 12' serves only to develop a high voltage across the pair to arc over the fault. Once the arc is started it is sustained by the 200 volt supply 77 providing the bias current.

Figure 4:
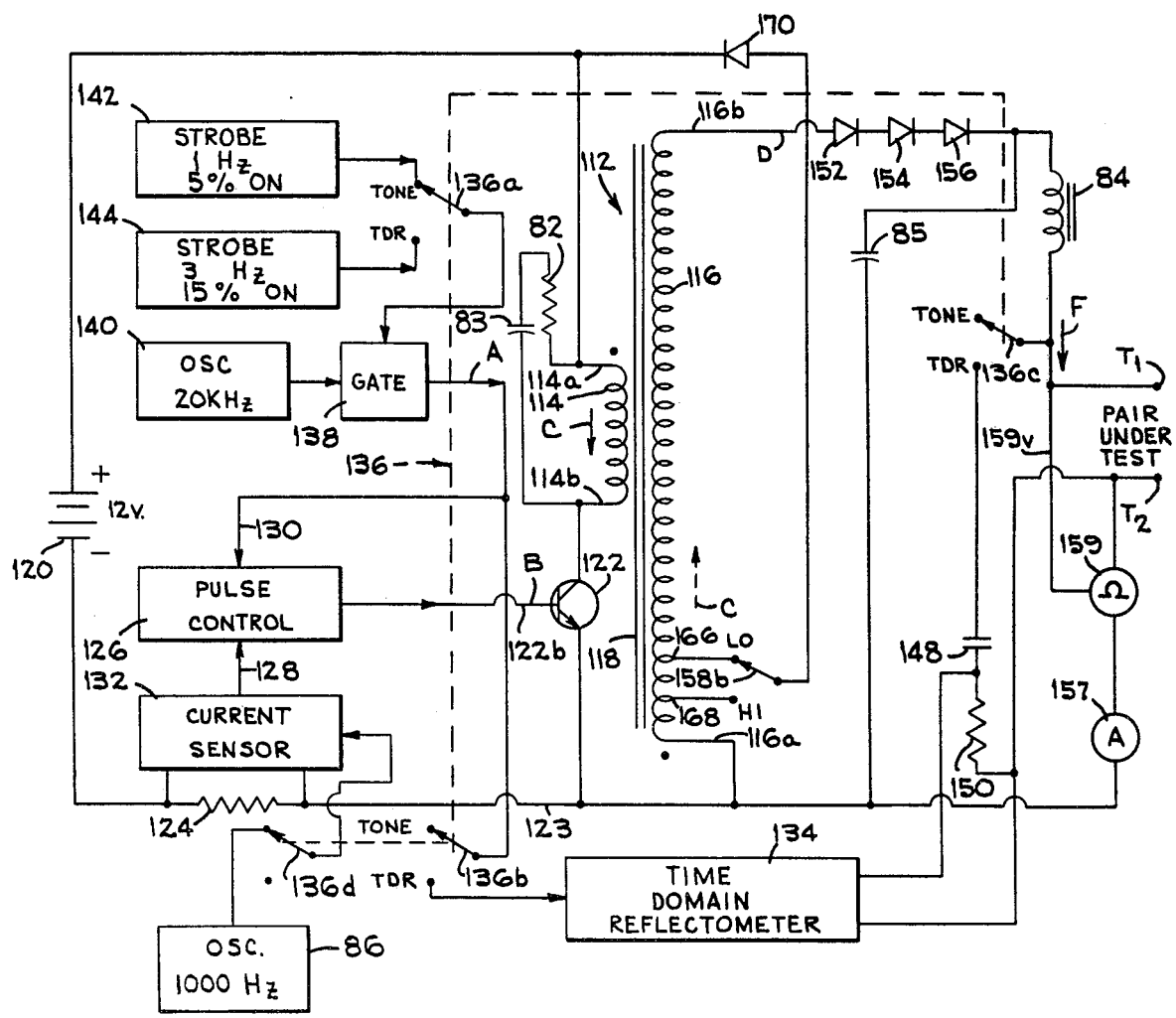
FIG. 4 is a schematic diagram of still another preferred form of a circuit embodying the invention.

Another alternate embodiment of the invention is shown schematically in FIG. 4. Elements of FIG. 4 that are similar in structure and function to elements in FIG. 1 are identified by reference numerals that are greater by 100 than corresponding reference numerals in FIG. 1. Thus in the embodiment of FIG. 4, there is a flyback transformer 112 which has a primary winding 114 and a secondary winding 116, the pair under test being connected to terminals $T_1$ and $T_2$ which in turn are connected across secondary winding 116 through diodes 152, 154 and 156. In the embodiment of FIG. 4 the flyback transformer is caused to operate at 20 kHz by oscillator 140. At such high frequencies it is preferable to provide a snubbing network in parallel with primary winding 114, the snubbing network including a resistor 82 in series with a capacitor 83. The snubbing network functions to dissipate switching transients arising from the relatively high frequency (20 kHz) voltage so as to protect switching transistor 122. The output current is produced by rectifying and filtering the 20 kHz signal at secondary winding 116, an inductor 84 and a capacitor 85 performing such filtering function. The inductance of inductor 84 and the capacitance of capacitor 85 are such as to filter effectively the 20 kHz signal from oscillator 140 and to pass the audible 1000 Hz signal from oscillator 86.

In order to produce an audible tone when the circuit of FIG. 4 is operated in the tone mode there is a moving contact 136d which has a fixed contact active in the tone mode to which is connected to 1000 Hz oscillator. Moving contact 136d is connected to current sensor 132 so as to vary at 1000 Hz the level of current at which the current sensor turns off pulse control 126. Thus, the magnitude of the current delivered to the pair under test varies at a 1000 Hz audible rate. Current sensor 132 operates so that the output current is not allowed to be reduced below a minimum value as the current is varied, thus maintaining the bias current $I_b$.

In order to avoid generation of excessive heat at the arc plasma at the cable fault, strobe 142 in FIG. 4 is on 5% of the time in the tone mode. The balance of the time is available for dissipation of heat in the cable at the region of the arc plasma. In the TDR mode strobe 144 operates at a 3 Hz rate and has a 15% on time to effect similar reduction in the duty cycle. Switch contact 136d disconnects oscillator 86 in the TDR mode, because no audible signal is needed in that mode and because such audible signal might produce noise on the TDR display. Current sensor 132 operates in the TDR mode to assure that a current of at least $I_b$ flows at all times that strobe 144 is on. The duration of the arc plasma in the TDR mode is about 50 milliseconds, which is sufficient for a sampling TDR, such as Tektronix 1503, to locate the low resistance arc plasma. The remaining elements and their functions of FIG. 4 are the same as has been described previously.

In operation in the tone mode, the circuit of FIG. 4 is activated by moving mode switch 136 to the position shown in the drawing. At such position transistor 122 is turned on and off at the rate of 20 kHz. A signal of the same frequency is induced in the secondary by flyback action in transformer 112 and current is caused to flow toward the fault in the pair connected to terminals $T_1$ and $T_2$, producing an increasing voltage across the pair. When the fault breaks down and an arc plasma is present, the consequent current flow through resistor 124 causes reduction of the on time of transistor 122 through pulse control 126. Accordingly, the current flow through the ac plasma and the heat produced thereby is limited. Concurrent with the foregoing a DC current that varies at 1000 Hz is produced so that the current through the conductor and the arc plasma is substantially that shown in curve F of FIG. 3A. The filter formed by inductor 84 and capacitor 85 filters the 20 kHz frequency from the line so that detection of the 1000 Hz by inductive or sonic pick up means can be achieved. The 20 kHz signal is not shown in the curve in FIG. 3A for reasons of drafting convenience and the fact that the current flow pattern through the fault is substantially the same as produced by the circuit of FIG. 3. Because of the modulation scheme established by coaction of oscillator 86 and current sensor 132 the duty factor of the AC or tone portion of current flow is automatically prevented from exceeding 50%; therefore, a secondary switch such as that exemplified by transistor 60' in FIG. 3, is unnecessary to limit current flow through the pair under test. Current sensor 132, in cooperation with current resistor 124, affords control of primary transistor 122 so that the magnitude of current flow is reduced before excessive heating at the arc plasma occurs. In the tone mode, the level at which current sensor 132 responds is varied at a 1000 Hz rate. As has been indicated, the filter composed of inductor 84 and capacitor 85 is such as freely to pass the 1000 Hz signal so that a readily detectable audible or sonic tone is produced in the cable between the apparatus and the cable fault. Finally it is noted that between successive strobe pulses from strobe 142, the apparatus is inactive so as to provide adequate time for the heat at the arc plasma to dissipate, thus avoiding any damage to the conductors or to the insulation adjacent to the fault.

In the TDR mode, timing is governed by strobe 144, the specific strobe shown in the drawing acting to turn on the system for a period of about 50 milliseconds every 333 milliseconds. Such on time for the system is sufficient to establish the arc plasma at the fault and to permit TDR 134 to locate the fault. During operation in the TDR mode, current through the fault and the cable pair is controlled as indicated above, and the DC bias, $I_b$, is produced as described previously. Switch contacts 136d are open in the TDR mode so that no 1000 Hz signal is superimposed on the output current. Only a steady DC current is driven through the arc plasma for the duration of each strobe pulse, and the circuit is inactive between strobe pulses.

In the foregoing descriptions, specific frequencies and parameters have been given. It is to be understood that these specific parameters are only exemplary because although various adaptations and modifications will be obvious to those skilled in the art, the true spirit and scope of the invention is as defined in the appended claims. Thus, it will be seen that the present invention provides a circuit for locating a fault in an inaccessible portion of a cable without requiring that the fault first be converted to a hard short by burn in techniques. The production of a controlled arc plasma across a relatively high resistance effectively converts the resistance to a very low resistance while the arc is present which can be located either by loop resistance measurement, by tone tracing techniques or by time domain reflectometer techniques.

Although several embodiments of the invention have been shown and described, it will be obvious that other adaptations and modifications can be made without departing from the true spirit and scope of the invention.

What is claimed is:

1. A system for locating a high resistance fault between a conductor pair comprising a switchable current pulse source for producing a current pulse at a voltage sufficient to temporarily arc across the fault to form at the fault a temporary arc plasma having a low resistance current path therethrough, nondissipating current limiting means for limiting the current through the low resistance path to limit the power dissipated in the arc so as to avoid fusing the conductor, and detecting means for affording detection of the location of the low resistance path during the presence of the arc plasma.

2. A system according to claim 1 wherein said detecting means comprises means for periodically interrupting said pulse source at a rate to facilitate inductive pickup of the current the system causes to flow along said conductor pair and through the arc plasma.

3. A system according to claim 2 wherein said detecting means comprises a direct current power source so that said interrupting means produces pulsating direct current.

4. A system according to claim 1 wherein said detecting means includes a time domain reflectometer producing measuring impulses and means for synchronizing the time domain reflectometer with said pulse source so that said time domain reflectometer is active during existence of said arc plasma across the fault and so that said impulses are reflected by the low impedence plasma path across said arc.

5. A system according to claim 1 wherein said detection means includes means for measuring the current through one of the conductors, means for measuring the voltage across the conductors while the arc plasma is sustained, and means for displaying the quotient of the measured voltage divided by the measured current to display the loop resistance to the fault.

6. A system according to claim 1 wherein said detecting means includes means for periodically interrupting said pulse source at an audible rate so that an audio frequency current is made to flow through the arc plasma thereby generating sound waves within the plasma to facilitate sonic pickup of current flowing through the arc plasma.

7. a system according to claim 1 including means for producing a DC bias current to the conductor pair and the arc plasma, said pulses being superimposed on said DC bias current, said current limiting means including means for regularly terminating the DC bias current to afford dissipation of heat from said arc plasma.

8. A system according to claim 1 wherein said pulse source includes an inductor, means for supplying current to said inductor to effect storage of energy therein, means for causing said inductor to fly back and rapidly discharge the stored energy, and means connecting said conductor pair across said inductor to receive the energy discharged therefrom.

9. A system according to claim 8 wherein said inductor includes a flyback transformer having a primary winding, a secondary winding and a core flux linking said windings, there being means for coupling said conductor pair across said secondary winding, wherein said current supplying means includes means for gating current flow through said primary windings, and wherein said current limiting means includes means in series with said current supplying means for sensing the magnitude of current flow therethrough and means responsive to said current sensing means for disabling said gating means when the current reaches a preselected magnitude.

10. A system according to claim 9 wherein said gating means includes means for generating a square wave having a repetition rate with a period less than the decay time of the arc plasma across the fault and wherein said disabling means includes means for reducing the on time of said square wave in response to the magnitude of current sensed by said current sensing means.

11. A system for locating a high resistance fault between two conductors in a cable comprising means for applying a voltage across the conductors so as temporarily to produce an arc plasma between the conductors at the high resistance fault, said voltage applying means including a switchable current pulse source, nondissipating means for limiting the current through the arc plasma to limit power so as to avoid damage to the conductors, said nondissipating current limiting means acting to switch said switchable current pulse source, and means for affording detection of the location of the low resistance path through the arc plasma while the arc plasma exists.

12. A system according to claim 11 wherein said detection affording means comprises means for varying the magnitude of current flow through the arc plasma at a rate to permit inductive pickup thereof.

13. A system according to claim 12 wherein said current magnitude varying means varies the current flow through the arc plasma at an audible rate.

14. A system according to claim 13 wherein said current magnitude varying means includes a source of direct current and means for periodically varying said direct current so that only pulsating direct current is caused to flow through said arc.

15. A system according to claim 11 including bias current producing means associated with said voltage applying means for producing a low level DC bias current through said conductors and said arc plasma, said bias current facilitating maintenance of said arc plasma, said current limiting means limiting said DC bias current.

16. A system according to claim 11 wherein said voltage applying means includes an inductor, means for supplying current to said inductor to effect storage of energy therein, means for causing said inductor to fly back and rapidly discharge the stored energy, and means connecting the conductors across said inductor to receive the energy discharged therefrom.

17. A system according to claim 16 wherein said inductor includes a transformer having a core, a primary winding flux linked to the core and a secondary winding flux linked to the core, and wherein said current supplying means includes a pulse source for supplying current pulses to said primary winding, and wherein said flyback causing means includes a switch connected across at least a part of said secondary winding and being controlled by said pulse source so as to short out said secondary winding after termination of current supplied to said primary winding, said conductors being connected across said secondary winding so upon opening of said switch said secondary flies back to apply a voltage across said conductors.

18. A system according to claim 17 in combination with means for measuring the magnitude of current flow through said arc and means responsive to said current measuring means for deactivating said pulse source when the current flow reaches a preselected magnitude below a magnitude that overheats the conductors.

19. A system according to claim 17 wherein said pulse source produces repetitive pulses at a relatively high rate so that said transformer flies back at a corresponding rate, filter means in series between said secondary winding and said conductors for filtering said pulses at said relatively high rate, and means for varying the magnitude of said pulses produced at said relatively high rate at an audible rate, said filter means being constructed and arranged to pass signals at said audible rate to facilitate audio detection of said fault.

20. A system according to claim 19 including means for controllably switching said repetitive pulse source produced at a relatively high rate between an on state and an off state, said on state having a duration sufficient to permit locating said arc plasma with a time domain reflectometer, said off state having a duration sufficient to affort extinguishment of said arc plasma and dissipation of heat at the fault.

21. A system for locating a high resistance short between a pair of conductors comprising a transformer having a secondary winding coupled across the conductors, a primary winding and a core flux linking the primary and secondary windings, a power source and a series connected primary switch connected in series with the primary winding so as to produce a current flow therethrough when the primary switch is closed, means for periodically closing and opening the primary switch so as to produce pulsating current flow through said primary winding, said transformer tending to fly back in response to opening said primary switch, switching means connected across at least a part of said secondary winding for shorting the same during opening of said primary switch so that upon opening of said switching means said transformer flies back to produce a voltage pulse across said secondary winding, said secondary winding having a tap and feedback means connected from said tap to said power source for limiting the voltage at said tap to that of said power source so that the location of said tap establishes the output voltage of said secondary winding.

22. a system according to claim 21 including a second tap on said secondary winding, said second tap being spaced from first said tap, and means for selectively connecting said feedback means to respective said taps to alter the output voltage of said secondary winding.

23. A system for locating a high resistance fault between a conductor pair comprising a pulse source for producing a pulse at a voltage sufficient to arc across the fault to form a low resistance current path therethrough, said pulse source including a flyback transformer having a primary winding, a secondary winding, a core flux linking said windings, a current source for supplying current to said primary winding to store energy in said core and means for gating current flow from said current supplying means through said primary winding; means for connecting said conductor pair across said secondary winding; means for limiting the current through the low resistance path to avoid fusing the conductor, said current limiting means including means in series with said current supplying means for sensing the magnitude of current flow therethrough and means responsive to said current sensing means for disabling said gating means when the current reaches a preselected magnitude; and detecting means for affording detection of the location of the low resistance path.

24. A system according to claim 23 wherein said gating means includes means for generating a square wave having a repetition rate with a period less than the decay time of the arc plasma across the fault and wherein said disabling means includes means for reducing the on time of said square wave in response to the magnitude of current sensed by said current sensing means.

25. A system for locating a high resistance fault between two conductors in a cable comprising means for applying a voltage across the conductors so as to produce an arc between the conductors at the high resistance fault, said voltage applying means including a transformer having a core, a primary winding flux linked to the core, a secondary winding flux linked to the core, a pulse source for supplying current pulses to said primary winding so that the transformer flies back upon termination of each said current pulse, and means for connecting the conductors across the secondary winding to receive energy when said transformer flies back; means for limiting the current through the arc to avoid damage to the conductors, said current limiting means including a switch connected across at least a part of said secondary winding and being controlled by said pulse source so as to short out said secondary winding after termination of current supplied to said primary winding; and means for affording detection of the location of the arc.

26. A system according to claim 25 in combination with means for measuring the magnitude of current flow through said arc and means responsive to said current measuring means for deactivating said pulse source when the current flow reaches a preselected magnitude below a magnitude that overheats the conductors.

27. A system for locating a high resistance fault between a conductor pair comprising a pulse source for producing a pulse at a voltage sufficient to temporarily arc across the fault to form at the fault a temporary arc plasma having a low resistance current path therethrough, said pulse source including an inductor, means for supplying current to said inductor to effect storage of energy therein, means for causing said inductor to fly back and rapidly discharge the stored energy and means connecting said conductor pair across said inductor to receive the energy discharged therefrom, means for limiting the current through the low resistance path to limit the power dissipated in the arc so as to avoid fusing the conductor, and detecting means for affording detection of the location of the low resistance path during the presence of the arc plasma.

28. A systen for locating a high resistance fault between two conductors in a cable comprising means for applying a voltage across the conductors so as temporarily to produce an arc plasma between the conductors at the high resistance fault, said voltage applying means including an inductor, means for supplyng current to said inductor to effect storage of energy therein, means for causing said inductor to fly back and rapidly discharge the stored energy and means connecting the conductors across said inductor to receive the energy discharged therefrom, means for limiting the current through the arc plasma to limit power so as to avoid damage to the conductors, and means for affording detection of the location of the low resistance path through the arc plasma while the arc plasma exists.

* * * * *